United States Patent
Classen et al.

(10) Patent No.: US 10,017,376 B2
(45) Date of Patent: Jul. 10, 2018

(54) MEMS ELEMENT INCLUDING A STRESS DECOUPLING STRUCTURE AND A COMPONENT INCLUDING SUCH A MEMS ELEMENT

(71) Applicant: Robert Bosch GmbH, Stuttgart (DE)

(72) Inventors: Johannes Classen, Reutlingen (DE); Jochen Reinmuth, Reutlingen (DE); Mirko Hattass, Stuttgart (DE); Ralf Reichenbach, Esslingen (DE); Antoine Puygranier, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/311,706

(22) PCT Filed: May 29, 2015

(86) PCT No.: PCT/EP2015/061984
§ 371 (c)(1),
(2) Date: Nov. 16, 2016

(87) PCT Pub. No.: WO2015/185455
PCT Pub. Date: Dec. 10, 2015

(65) Prior Publication Data
US 2017/0096331 A1   Apr. 6, 2017

(30) Foreign Application Priority Data

Jun. 6, 2014  (DE) ........................ 10 2014 210 945

(51) Int. Cl.
*B81B 7/00*    (2006.01)
(52) U.S. Cl.
CPC ...... *B81B 7/0048* (2013.01); *B81B 2207/012* (2013.01); *B81B 2207/07* (2013.01)

(58) Field of Classification Search
CPC .............. B81B 7/0048; B81B 2207/07; B81B 2207/012
See application file for complete search history.

(56) References Cited

U.S. PATENT DOCUMENTS

| | | | |
|---|---|---|---|
| 7,280,262 B1 | 10/2007 | Foster | |
| 2007/0190680 A1 | 8/2007 | Fukuda et al. | |

(Continued)

FOREIGN PATENT DOCUMENTS

| | | |
|---|---|---|
| CN | 1906120 A | 1/2007 |
| CN | 102315183 A | 1/2012 |

(Continued)

OTHER PUBLICATIONS

International Search Report dated Aug. 18, 2015, of the corresponding International Application PCT/EP2015/061987 filed May 29, 2015.

*Primary Examiner* — Kyoung Lee
*Assistant Examiner* — Christina Sylvia
(74) *Attorney, Agent, or Firm* — Norton Rose Fulbright US LLP; Gerard Messina

(57) ABSTRACT

Measures are described which contribute simply and reliably to the mechanical decoupling of a MEMS functional element from the structure of a MEMS element. The MEMS element includes at least one deflectable functional element, which is implemented in a layered structure on a MEMS substrate, so that a space exists between the layered structure and the MEMS substrate, at least in the area of the functional element. According to the invention, a stress decoupling structure is formed in the MEMS substrate in the form of a blind hole-like trench structure, which is open to the space between the layered structure and the MEMS substrate and extends into the MEMS substrate to only a predefined depth, (Continued)

so that the rear side of the MEMS substrate is closed, at least in the area of the trench structure.

8 Claims, 3 Drawing Sheets

(56) References Cited

U.S. PATENT DOCUMENTS

| | | | |
|---|---|---|---|
| 2009/0079037 A1 | 3/2009 | Weber et al. | |
| 2013/0285166 A1* | 10/2013 | Classen | B81C 1/00246 |
| | | | 257/415 |
| 2014/0091405 A1* | 4/2014 | Weber | B81B 3/0021 |
| | | | 257/415 |

FOREIGN PATENT DOCUMENTS

| | | | |
|---|---|---|---|
| CN | 103373695 A | 10/2013 | |
| JP | H11281667 A | 10/1999 | |
| JP | 4925272 B2 | 4/2012 | |
| JP | 4925275 B2 | 4/2012 | |
| WO | 2014020387 A1 | 2/2014 | |

* cited by examiner

MEMS ELEMENT INCLUDING A STRESS DECOUPLING STRUCTURE AND A COMPONENT INCLUDING SUCH A MEMS ELEMENT

BACKGROUND INFORMATION

The present invention relates to a MEMS element including at least one deflectable functional element, which is implemented in a layered structure on a MEMS substrate, so that a space exists between the layered structure and the MEMS substrate, at least in the area of the functional element, and including a stress decoupling structure, which is formed in the MEMS substrate. Furthermore, the present invention relates to a component including such a MEMS element.

MEMS elements may be used, for example, as sensor elements for detecting and measuring accelerations, rotation rates, magnetic fields and pressures for the most varied applications, for example, in the automotive technology and consumer segment. Particular emphasis is placed on miniaturization of the elements and components including high function integration. In this respect, so-called bare die or chip scale packages prove to be particularly advantageous, since repackaging of the chips is omitted in this case. Instead, the MEMS chip is either assembled directly on an application circuit board (bare die) or in the chip stack of a vertically hybrid integrated component (chip scale package).

Due to the direct assembly of the MEMS chip or chip stack as part of the 2nd level assembly, deformations of the application circuit board are very directly coupled into the MEMS element. In this process, stress effects occur, which may severely impair the MEMS function.

The sensitivity to stress of MEMS elements of the type discussed here may be reduced with the aid of a stress decoupling structure in the MEMS substrate. Consequently, MEMS elements having deep trenches in the rear side of the substrate are known. These trenches are placed circumferentially in relation to the deflectable functional element, which is formed in the MEMS layered structure. The extremely thinned segments of the MEMS substrate in the trench area may readily absorb the deformation of a carrier, while the MEMS substrate in the area of the functional element experiences no more than a slight deformation due to its being very thick and stiff in comparison.

However, in practice, the conventional stress decoupling structure proves to be problematic in several respects.

Since the trench structure is applied in the rear side of the substrate, particles may collect in the trench structure during further processing, which may completely cancel the stress decoupling effect or at least significantly reduce it. The local coupling on a single location and a simultaneous leverage effect may even increase the input of stress into the MEMS structure of the functional element. The trench structure may actually be filled with an elastic material in order to prevent an introduction of particles. However, this is invariably associated with a significantly limited stress decoupling effect.

Moreover, the depth of the trench structure in relation to the thickness of the MEMS substrate must be defined very precisely in order to achieve an effective stress decoupling. Depending on the thickness of the MEMS substrate, this is connected with comparatively high technical manufacturing complexity and is accordingly cost-intensive.

SUMMARY

The present invention provides measures which contribute simply and reliably to the mechanical decoupling of a MEMS functional element from the structure of a MEMS element of the type named at the outset.

According to the present invention, this is achieved with the aid of a stress decoupling structure, which is implemented in the form of a blind hole-like trench structure in the MEMS substrate, which is open toward the space between the layered structure and the MEMS substrate and extends into the MEMS substrate to only a predefined depth, so that the rear side of the MEMS substrate is closed, at least in the area of the trench structure.

According to the present invention, a decoupling of stress and vibration between the MEMS functional element and element structure may also be achieved using a trench structure, which is formed under the layered structure in the MEMS substrate, which thus does not extend from the rear side of the substrate but from the front side of the substrate. Since the rear side of the trench structure is closed according to the present invention, it is comparatively protected. Particles may penetrate at the most into the trench structure in the MEMS substrate via the MEMS structure in the layered structure. The stress decoupling effect of the trench structure according to the present invention is correspondingly reliable.

Basically, there are various possibilities for implementing a MEMS element including a stress decoupling structure according to the present invention, in particular with respect to the positioning, geometry and also the number of trenches in the MEMS substrate.

Advantageously, the trench structure is situated under the edge area of the deflectable functional element or is offset outwards in relation to it. In this case, deformations of an element carrier are introduced from the stress-sensitive area of the deflectable functional element, where the MEMS substrate is comparatively thick into the trench structure, i.e., into a substrate area, over which no stress-sensitive structural elements are formed.

In a preferred specific embodiment of the MEMS element according to the present invention, the trench structure is formed circumferentially in relation to the deflectable functional element. In this case, the stress decoupling effect is particularly effective.

It has been shown that corners in the profile of the trench structure have an adverse effect on the stress decoupling effect. For this reason, the profile of the trench structure should preferably be made up of straight, arch-shaped and/or round segments.

It is particularly advantageous if the trench structure includes multiple trenches extending generally in parallel, at least in sections, the trenches being separated from one another in the MEMS substrate by webs. In this case, it is not the trench depth that determines the decoupling properties but rather the ratio of web width to trench depth or web height. This ratio may be selected freely. Such trenches/web structures may be manufactured very simply using defined dimensions. Moreover, the manufacturing process is largely independent of the substrate thickness.

As already mentioned, the stress decoupling structure according to the present invention is designed in particular for MEMS elements, which are intended to be installed as part of a bare die assembly or a vertically hybrid integrated component. The MEMS element is frequently assembled face down using flip-chip methods, i.e., with the MEMS layered structure mounted on a carrier. In the case of a bare die assembly, this is an application circuit board. In the case of a vertically hybrid integrated component, an ASIC element, for example, may function as a carrier.

For micromechanical functions that do not require media access, such as, for example, acceleration measurement and rotation rate measurement, the MEMS element should not only be mounted on the carrier in such a way that the deflectability of the functional element in the MEMS layered structure is ensured. In these applications, it also proves to be advantageous if the mechanical connection between the MEMS layered structure and the carrier completely surrounds the deflectable functional element, so that it is hermetically sealed between the MEMS substrate and the carrier.

It is a particular advantage if the mechanical connection between the MEMS layered structure and the carrier is designed to be offset outwards in relation to the trench structure in the MEMS substrate. In this case, neither the micromechanical function nor the stress decoupling of the MEMS element may be adversely affected by particles in the component surroundings. Moreover, in addition to the horizontal stress decoupling via the trench structure in the MEMS substrate, a vertical stress decoupling may be achieved via the layered structure. This vertical stress decoupling effect is particularly great if the functional element in the MEMS layered structure is mechanically decoupled from the MEMS layered structure in the connection area.

BRIEF DESCRIPTION OF THE DRAWINGS

As discussed above, there are various options for embodying and refining the present invention in an advantageous manner. To this end, reference is made to the description below of multiple exemplary embodiments of the present invention with reference to the figures.

DETAILED DESCRIPTION OF EXAMPLE EMBODIMENTS

Figure 1:
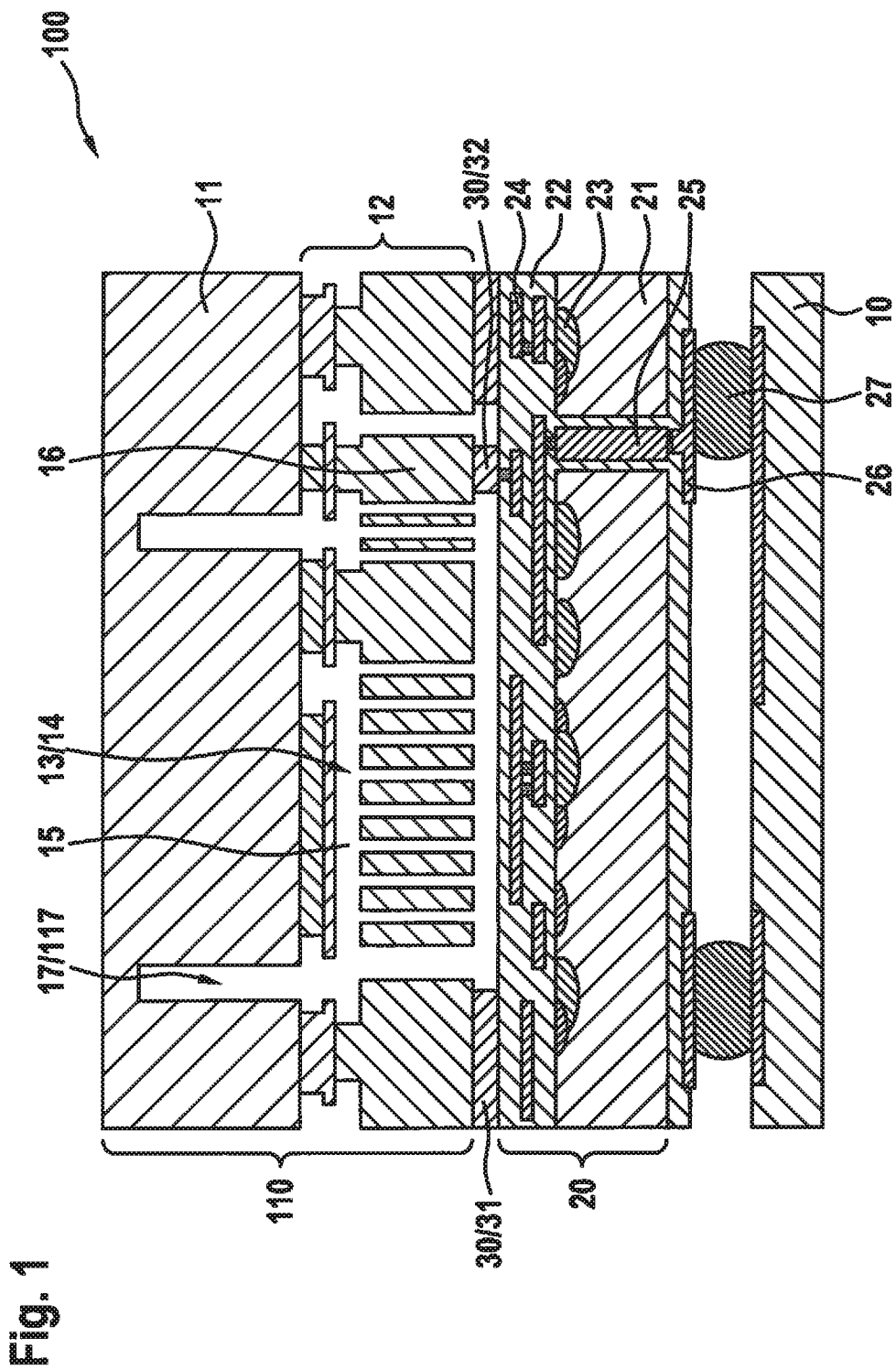
FIGS. 1 through 3 each show a schematic sectional view of a vertically hybrid integrated component 100, 200 and 300 including a MEMS element for detecting accelerations, which is equipped with a stress decoupling structure according to the present invention.
Figure 2:
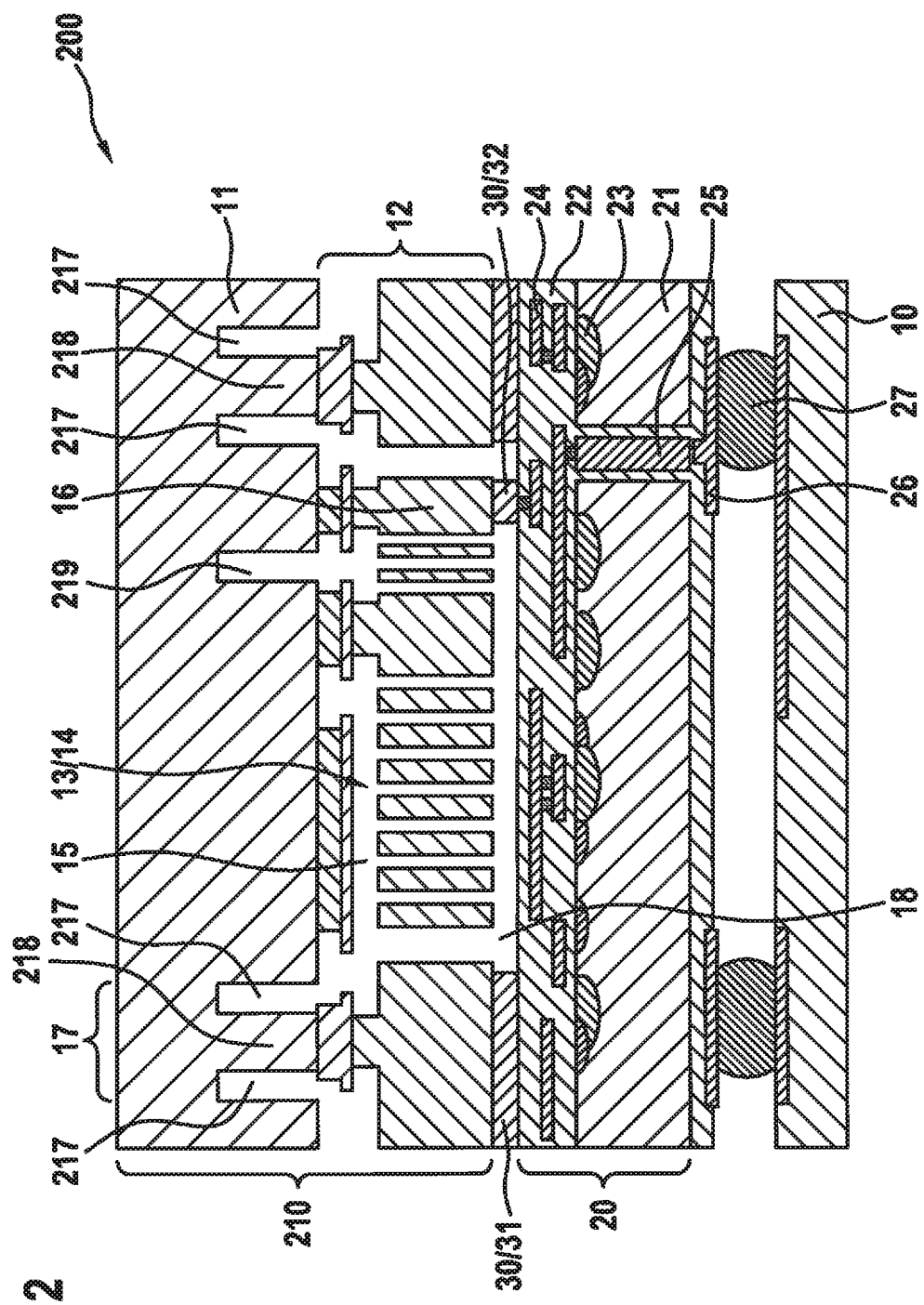
Figure 3:
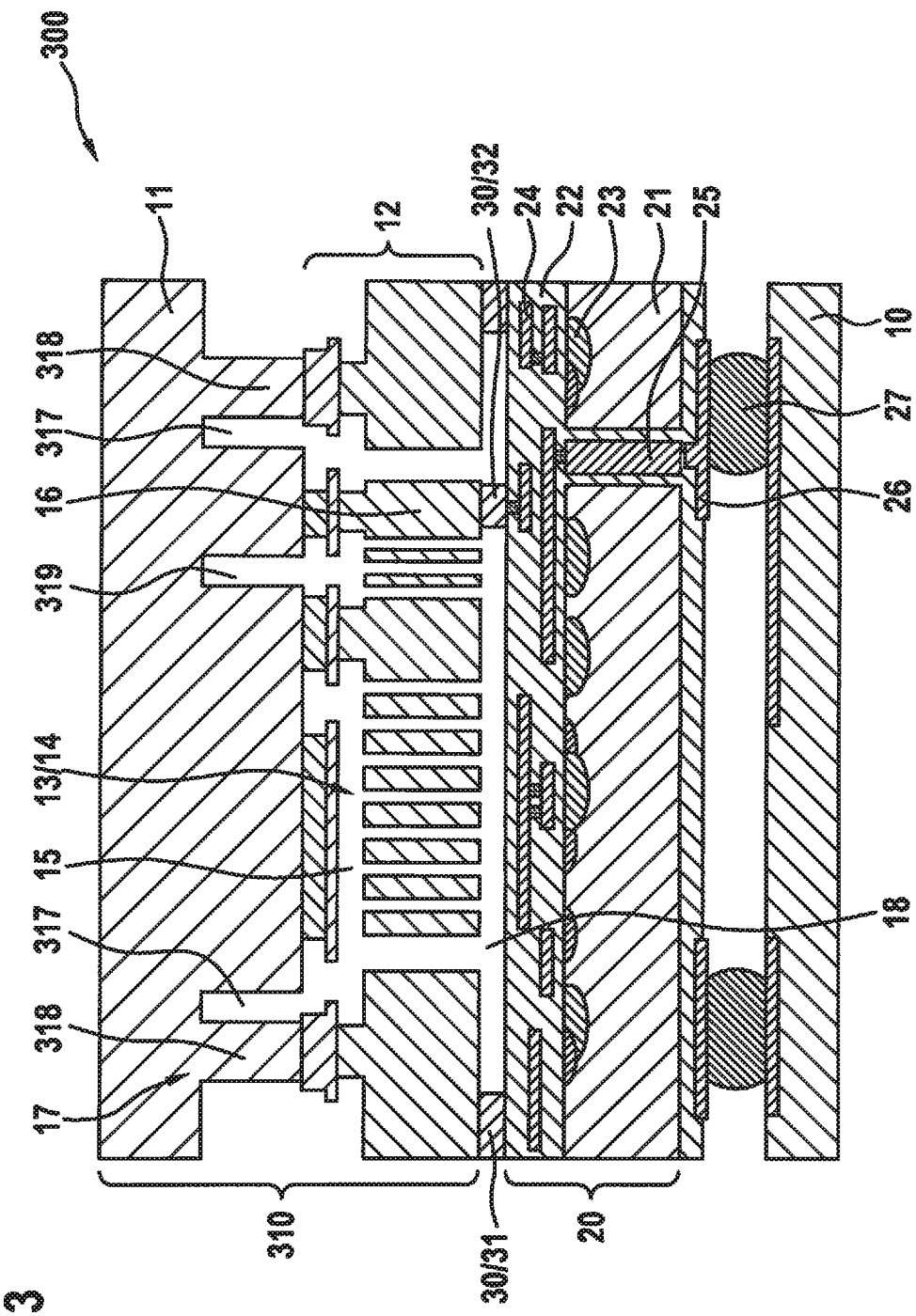

All three vertically hybrid integrated components 100, 200 and 300 shown in FIGS. 1 through 3 are mounted on an application circuit board 10 and include MEMS elements 110, 210 and 310 and an ASIC element 20. MEMS elements 110, 210 and 310 and ASIC element 20 are each assembled face-to-face, i.e., the active side of the MEMS chip, in which the sensor structure is formed, was connected to the active side of the ASIC chip, on which the circuit functions are implemented.

Sensor structures 13 of MEMS elements 110, 210 and 310 are identical. They include at least one deflectable functional element 14, which together with a signal detector, which are not indicated here in greater detail, are implemented in a layered structure 12 on a MEMS substrate 11. Another part of sensor structure 13 functions as an electrical terminal 16. In order to ensure the movability of this functional element 14, a space 15 is formed at least between functional element 14 and MEMS substrate 11. All MEMS elements 110, 210 and 310 are equipped with a stress decoupling structure 17, which is located under layered structure 12 in MEMS substrate 11. MEMS elements 110, 210 and 310 of components 100, 200 and 300 differ only in the form of implementation of this stress decoupling structure 17, which is explained in detail in connection with FIGS. 1 through 3.

ASIC elements 20 of components 100, 200 and 300 are also identical. They include electrical circuit components 23, which are integrated into ASIC substrate 21. These are advantageously parts of a signal processing circuit for evaluating the sensor signals of MEMS elements 110, 210 and 310. A layered structure 22 including multiple wiring levels 24 for circuit functions 23 is located on ASIC substrate 21. With the aid of at least one via 25, wiring levels 24 of layered structure 22 are connected to a wiring level on the rear side of ASIC substrate 21, in which terminal pads 26 for the external electrical contacting of components 100, 200 and 300 are formed. The external contacting was implemented here in connection with the 2nd level assembly on application circuit board 10 with the aid of solder balls 27.

In the case of component 100 shown in FIG. 1, stress decoupling structure 17 is implemented in the form of a blind hole-like trench 117 under layered structure 12 in MEMS substrate 11. It extends from space 15 between sensor structure 13 and MEMS substrate 11 to a predefined depth in MEMS substrate 11, so that the rear side of MEMS substrate 11 is closed, at least in the area of trench 117. Trench 117 is placed circumferentially in relation to deflectable functional element 14 and is made up of straight, arch-shaped and round segments, so that its profile has preferably no corners. This is conducive to the mechanical decoupling of sensor structure 13 from the other components, via which assembly-related and thermally-related stress and also vibrations may be introduced into the sensor structure.

The connection between MEMS element 110 and ASIC element 20 was established by eutectic bonding. Connection layer 30 produced in this way forms a stand-off structure between MEMS layered structure 12 and ASIC element 20, which ensures the movability of sensor structure 13. Appropriate structuring of connection layer 30 established here a mechanical connection 31 between MEMS layered structure 12 and ASIC element 20, which completely surrounds sensor structure 13 including deflectable functional element 14, so that it is hermetically sealed between MEMS substrate 11 and ASIC element 20. Moreover, sensor structure 13 and electrical terminal 16 of sensor structure 13 was electrically connected to ASIC element 20 via connection layers 30 and 32. Mechanical connections 30 and 31 between MEMS layered structure 12 and ASIC element 20 are designed to be offset outwards in relation to trench structure 117 in MEMS substrate 11, so that trench structure 117 is also hermetically sealed and thus protected against the penetration of particles. Moreover, this system makes vertical stress decoupling possible via free-standing MEMS layered structure 12 in the connection area, which advantageously supplements the horizontal stress decoupling via trench structure 117 in MEMS substrate 11.

In contrast to the exemplary embodiment shown in FIG. 1, stress decoupling structure 17 in component 200 shown in FIG. 2 includes multiple blind hole-like trenches, namely two trenches 217 extending essentially in parallel, and an additional trench 219. Trenches 217 are separated from one another by a web 218 in MEMS substrate 11 and enclose the entire area of sensor structure 13. Additional trench 219 surrounds electrical terminal 16 of sensor structure 13. A separate trench structure 219 is thus provided here for the mechanical decoupling of the electrical terminal which is resiliently connected to sensor structure 13. Both trench structures 217 and 219 extend from a space 15 between MEMS layered structure 12 including sensor structure 13 and MEMS substrate 11 to a predefined depth in MEMS substrate 11. They may also be designed to be of different depth, even if they are of equal depth in the exemplary embodiment shown here.

The stress decoupling properties of double trench structure 217 are generally determined by the ratio of width to height of web 218, i.e., by the web depth and the trench depth. Advantageously, the ratio of web width to trench depth may largely be selected independent of the thickness of the MEMS substrate.

Here also, MEMS element 110 and ASIC element 20 are connected to one another mechanically and electrically via a eutectic bonding layer 30, in which a stand-off structure is formed. Moreover, sensor structure 13 including deflectable functional element 14 was hermetically sealed in a cavity 18 between MEMS substrate 11 and ASIC element 20 with the aid of bonding layer 30. Mechanical connections 30 and 31 between MEMS layered structure 12 and ASIC element 20 are formed here in the area of double trench structure 217, and in such a way that at least inner trench 217 is placed within circumferential bonding connection 31.

In the case of component 300 shown in FIG. 3, stress decoupling structure 17 includes a blind hole-like trench 317 in MEMS substrate 11, which extends circumferentially in relation to sensor structure 13 and exposes a web 318 in MEMS substrate 11 internally. On the outside of web 318, MEMS substrate 11 was completely removed. As in the case of component 200, the stress decoupling properties of trench structure 317 are essentially determined here by the ratio of width to height of web 318. Furthermore, the stress decoupling structure includes here a trench 319, which surrounds electrical terminal 16 of sensor structure 13. Both trench structures 317 and 319 extend from a space 15 between MEMS layered structure 12 including sensor structure 13 and MEMS substrate 11 to a predefined depth in MEMS substrate 11.

Eutectic bond connection 31 between MEMS element 310 and ASIC element 20 is designed to be offset outwards in relation to trench structures 317, 319 in MEMS substrate 11, so that, together with sensor structure 13, they are hermetically sealed between MEMS substrate 11 and ASIC element 20 and are in this manner protected against the penetration of particles. Moreover, this system makes a vertical stress decoupling possible via free-standing MEMS layered structure 12 in the connection area, which advantageously supplements the horizontal stress decoupling via trench structures 317 and 319 in the MEMS substrate.

For the manufacture of a MEMS element and a component as described above, the trenches of the stress decoupling structure are initially introduced into the front side of the MEMS substrate. Advantageously, the substrate front side is structured in a trench process with the aid of an etch mask, which has a lattice structure in the area of the trenches to be produced. This lattice structure is completely undercut during the trench process, so that a coherent trench is created, which is spanned by the lattice structure of the etch mask. After the structuring process, a closed layered structure is produced on the masked substrate surface, in which—independent of the trench structure in the substrate—the micromechanical sensor structure is formed.

As already mentioned, the profile of the stress decoupling structure in the MEMS substrate is preferably rounded and closed circumferentially. The sensor structure is subsequently placed within the enclosed area in the layered structure.

In one preferred specific embodiment, stress decoupling webs are formed in the MEMS substrate with the aid of the trenches. For this purpose, a double trench structure may be produced, as in the case of MEMS element 210. The outer trench may, however, also be extended to the chip edge, so that it is no longer recognizable as a trench, as in the case of MEMS element 310. In this case, the lateral overhang of the MEMS substrate may also be removed simply, for example, in a sawing process.

The connection between the MEMS element according to the present invention and the ASIC element of above-described components 100, 200 and 300 is produced using a conductive bonding method, for example using eutectic AlGe bonding. Consequently, the MEMS element and the ASIC element are both mechanically and electrically connected. Moreover, the sensor structure may be hermetically sealed in a cavity between the MEMS substrate and the ASIC element.

Advantageously, the connection areas between the MEMS element and ASIC element and the stress decoupling structure are situated offset in relation to one another in the MEMS substrate. In this case, the structured MEMS layered structure between the connection area and the stress decoupling structure additionally acts as a flexible and consequently stress decoupling element. Furthermore, primarily vertical deformations may be absorbed, while the stress decoupling structure in the MEMS substrate more likely absorbs horizontal deformations.

What is claimed is:

1. A MEMS element, comprising:
   at least one deflectable functional element implemented in a layered structure on a MEMS substrate, so that a space exists between the layered structure and the MEMS substrate, at least in the area of the at least one deflectable functional element; and
   a stress decoupling structure formed in the MEMS substrate, the stress decoupling structure being in the form of a blind hole-like trench structure, which is open to the space between the layered structure and the MEMS substrate and extends into the MEMS substrate to only a predefined depth, so that a rear side of the MEMS structure is closed, at least in the area of the blind hole-like trench structure,
   wherein the blind hole-like trench structure comprises at least two trenches, wherein the at least two trenches are separated from each other by a section of the MEMS substrate.

2. The MEMS element as recited in claim 1, wherein the blind hole-like trench structure is situated under an edge area of the deflectable functional element or is offset outwards in relation to it.

3. The MEMS element as recited in claim 1, wherein the blind hole-like trench structure is formed circumferentially in relation to the deflectable functional element.

4. The MEMS element as recited in claim 1, wherein a profile of the blind hole-like trench structure is made up of at least one of straight, arch-shaped and round segments.

5. A MEMS element, comprising:
   at least one deflectable functional element implemented in a layered structure on a MEMS substrate, so that a space exists between the layered structure and the MEMS substrate, at least in the area of the deflectable functional element; and
   a stress decoupling structure formed in the MEMS substrate, the stress decoupling structure being in the form of a blind hole-like trench structure, which is open to the space between the layered structure and the MEMS substrate and extends into the MEMS substrate to only a predefined depth, so that a rear side of the MEMS structure is closed, at least in the area of the blind hole-like trench structure,
   wherein the blind hole-like trench structure includes multiple trenches extending in parallel, at least in sections, the blind hole-like trenches being separated from one another in the MEMS substrate by webs.

6. A component, comprising:

at least one MEMS element including at least one deflectable functional element implemented in a layered structure on a MEMS substrate, so that a space exists between the layered structure and the MEMS substrate, at least in the area of the deflectable functional element, and a stress decoupling structure formed in the MEMS substrate, the stress decoupling structure being in the form of a blind hole-like trench structure, which is open to the space between the layered structure and the MEMS substrate and extends into the MEMS substrate to only a predefined depth, so that a rear side of the MEMS structure is closed, at least in the area of the blind hole-like trench structure; and a carrier for the MEMS element, the MEMS element being assembled face down on the carrier, so that deflectability of the deflectable functional element is ensured, wherein a mechanical connection between the MEMS layered structure and the carrier surrounds the deflectable functional element completely, so that it is hermetically sealed between the MEMS substrate and the carrier.

7. The component as recited in claim 6, wherein the mechanical connection between the MEMS layered structure and the carrier is designed to be offset outwards in relation to the stress decoupling structure in the MEMS substrate.

8. The component as recited claim 6, further comprising:

an ASIC element having circuit functions which are integrated into the ASIC substrate, and having a layered structure on the ASIC substrate, which includes at least one wiring level for the circuit functions, functioning as a carrier, wherein the MEMS element is assembled face down on the ASIC layered structure, so that the deflectability of the deflectable functional element is ensured, and an electrical connection being present between the deflectable functional element and at least one ASIC wiring level.

\* \* \* \* \*